United States Patent
Li et al.

(10) Patent No.: US 10,199,385 B1
(45) Date of Patent: Feb. 5, 2019

(54) NON-VOLATILE MEMORY DEVICE WITH REDUCED DISTANCE BETWEEN CONTROL GATE ELECTRODE AND SELECTING GATE ELECTRODE AND MANUFACTURING METHOD THEREOF

(71) Applicant: UNITED MICROELECTRONICS CORP., Hsin-Chu (TW)

(72) Inventors: Kuo-Lung Li, Yunlin County (TW); Ping-Chia Shih, Tainan (TW); Wen-Peng Hsu, New Taipei (TW); Chia-Wen Wang, Tainan (TW); Meng-Chun Chen, Kaohsiung (TW); Chih-Hao Pan, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/665,437

(22) Filed: Aug. 1, 2017

(51) Int. Cl.
| | |
|---|---|
| *H01L 27/115* | (2017.01) |
| *H01L 27/11568* | (2017.01) |
| *H01L 29/423* | (2006.01) |
| *H01L 29/792* | (2006.01) |
| *H01L 21/28* | (2006.01) |
| *H01L 29/66* | (2006.01) |

(52) U.S. Cl.
CPC .. *H01L 27/11568* (2013.01); *H01L 21/28282* (2013.01); *H01L 29/42344* (2013.01); *H01L 29/66833* (2013.01); *H01L 29/792* (2013.01)

(58) Field of Classification Search
CPC .................................................. H01L 21/28282
See application file for complete search history.

(56) References Cited

U.S. PATENT DOCUMENTS

| | | |
|---|---|---|
| 6,794,711 B2 | 9/2004 | Kang |
| 7,323,744 B2 | 1/2008 | Hayakawa |
| 2009/0045452 A1 | 2/2009 | Lue |
| 2015/0236170 A1* | 8/2015 | Kawashima ......... H01L 29/792 257/324 |

* cited by examiner

*Primary Examiner* — Eduardo A Rodela
*Assistant Examiner* — Nilufa Rahim
(74) *Attorney, Agent, or Firm* — Winston Hsu

(57) ABSTRACT

A non-volatile memory device includes a semiconductor substrate, a control gate electrode, a first oxide-nitride-oxide (ONO) structure, a selecting gate electrode, a second ONO structure, and a spacer structure. The control gate electrode and the selecting gate electrode are disposed on the semiconductor substrate. The first ONO structure is disposed between the control gate electrode and the semiconductor substrate. The second ONO structure is disposed between the control gate electrode and the selecting gate electrode in a first direction. The spacer structure is disposed between the control gate electrode and the second ONO structure in the first direction. A distance between the control gate electrode and the selecting gate electrode in the first direction is smaller than or equal to a sum of a width of the second ONO structure and a width of the spacer structure in the first direction.

10 Claims, 6 Drawing Sheets

NON-VOLATILE MEMORY DEVICE WITH REDUCED DISTANCE BETWEEN CONTROL GATE ELECTRODE AND SELECTING GATE ELECTRODE AND MANUFACTURING METHOD THEREOF

BACKGROUND OF THE INVENTION

1. Field of the Invention

The present invention relates to a memory device and a manufacturing method thereof, and more particularly, to a non-volatile memory device including an oxide-nitride-oxide (ONO) structure and a manufacturing method thereof.

2. Description of the Prior Art

Semiconductor memory devices are used in computer and electronics industries as a means for retaining digital information or data. Typically, the semiconductor memory devices are divided into volatile and non-volatile memory devices. The non-volatile memory devices, which can retain their data even when the power supply is interrupted, have been widely employed. As one kind of the non-volatile memory technology, a SONOS memory structure is to build a silicon nitride layer sandwiched between two silicon oxide layers for serving as the charge trapping layer while the two silicon oxide layers respectively serve as a charge tunnel layer and a charge block layer. This oxide-nitride-oxide (ONO) multilayered structure is disposed on a semiconductor substrate, a silicon floating gate may be disposed on the ONO multilayered structure, and thus a SONOS memory structure is constructed.

Since the microprocessors have become more powerful, requirement to memory devices of large-capacity and low-cost is raised. To satisfy such trend and achieve challenge of high integration in semiconductor devices, memory miniaturization is kept on going, and thus fabrication process of memory structure is getting complicated. Therefore, it is always a target for the related industries to effectively enhance integrity and density of the memory cells by modifying the designs.

SUMMARY OF THE INVENTION

A non-volatile memory device and a manufacturing method thereof are provided by the present invention. A control gate electrode and a selecting gate electrode are separated from each other by an oxide-nitride-oxide (ONO) structure and a spacer structure in a first direction, and a distance between the control gate electrode and the selecting gate electrode in the first direction is smaller than or equal to a sum of a width of the ONO structure and a width of the spacer structure in the first direction. Accordingly, the distance between the control gate electrode and the selecting gate electrode may be reduced and the density of memory cells in the non-volatile memory device may be enhanced.

According to one embodiment of the present invention, a non-volatile memory device is provided. The non-volatile memory device includes a semiconductor substrate, a control gate electrode, a first oxide-nitride-oxide (ONO) structure, a selecting gate electrode, a second ONO structure, and a spacer structure. The control gate electrode and the selecting gate electrode are disposed on the semiconductor substrate. The first ONO structure is disposed between the control gate electrode and the semiconductor substrate. The second ONO structure is disposed between the control gate electrode and the selecting gate electrode in a first direction. The spacer structure is disposed between the control gate electrode and the second ONO structure in the first direction. A distance between the control gate electrode and the selecting gate electrode in the first direction is smaller than or equal to a sum of a width of the second ONO structure and a width of the spacer structure in the first direction.

According to one embodiment of the present invention, a manufacturing method of a non-volatile memory device is provided. The manufacturing method includes the following steps. A control gate electrode is formed on a semiconductor substrate. A first oxide-nitride-oxide (ONO) structure is formed between the control gate electrode and the semiconductor substrate. A selecting gate electrode is formed on the semiconductor substrate. A second ONO structure and a spacer structure are formed between the control gate electrode and the selecting gate electrode in a first direction. A distance between the control gate electrode and the selecting gate electrode in the first direction is smaller than or equal to a sum of a width of the second ONO structure and a width of the spacer structure in the first direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic drawings illustrating a manufacturing method of a non-volatile memory device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

FIGS. 9-12 are schematic drawings illustrating a manufacturing method of a non-volatile memory device according to a second embodiment of the present invention, wherein FIG. 10 is a schematic drawing in a step subsequent to FIG. 9, FIG. 11 is a schematic drawing in a step subsequent to FIG. 10, and FIG. 12 is a schematic drawing in a step subsequent to FIG. 11.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Figure 6:
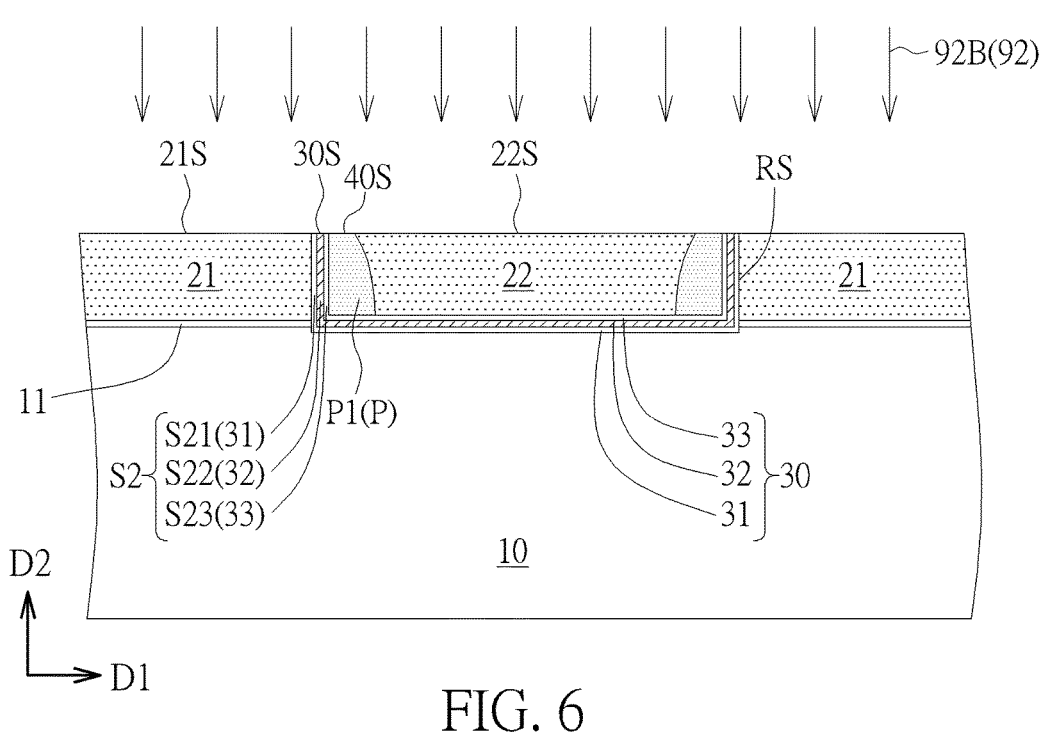
Figure 7:
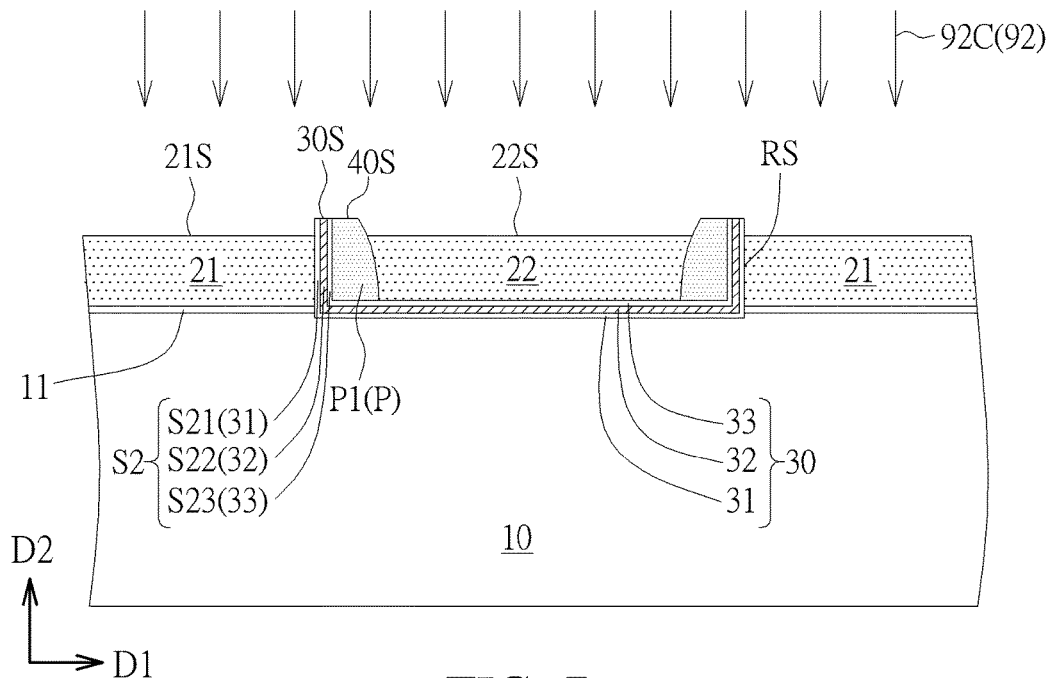
Figure 8:
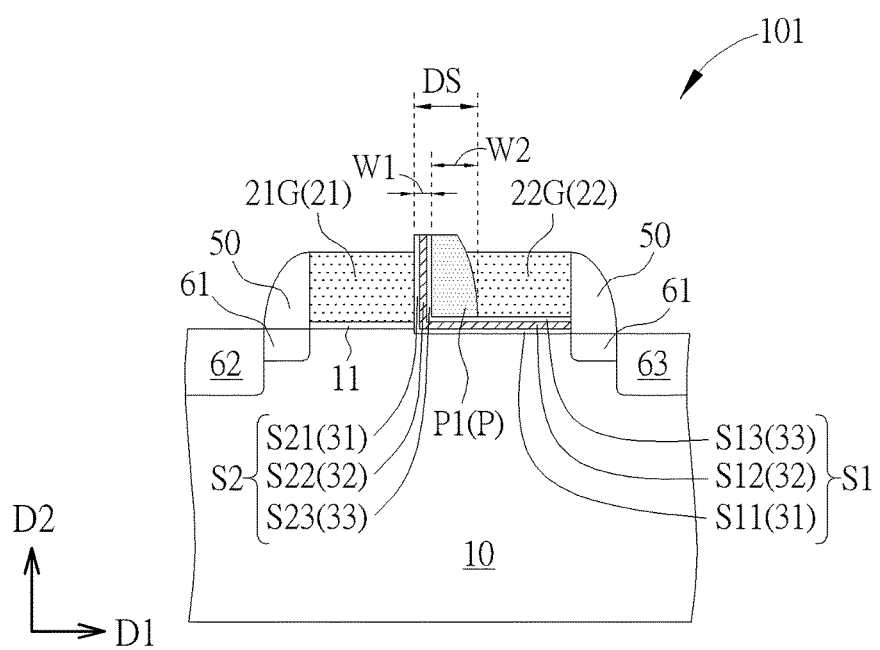

Please refer to FIGS. 1-8. FIGS. 1-8 are schematic drawings illustrating a manufacturing method of a non-volatile memory device according to a first embodiment of the present invention. As shown in FIG. 8, the manufacturing method in this embodiment may include the following steps. A control gate electrode 22G is formed on a semiconductor substrate 10. A first oxide-nitride-oxide (ONO) structure S1 is formed between the control gate electrode 22G and the semiconductor substrate 10. A selecting gate electrode 21G is formed on the semiconductor substrate 10. A second ONO structure S2 and a spacer structure P are formed between the control gate electrode 22G and the selecting gate electrode 21G in a first direction D1. A distance DS between the control gate electrode 22G and the selecting gate electrode 21G in the first direction D1 is smaller than or equal to a sum of a width of the second ONO structure S2 (such as a first width W1 shown in FIG. 8) and a width of the spacer structure P (such as a second width W2 shown in FIG. 8) in the first direction D1. In other words, the control gate electrode 22G and the selecting gate electrode 21G in the first direction D1 by the second ONO structure S2 and the spacer structure P only for reducing the distance DS between the control gate electrode 22G and the selecting gate electrode 21G in the first direction D1 and enhancing the density of memory cells in the non-volatile memory device.

Figure 1:
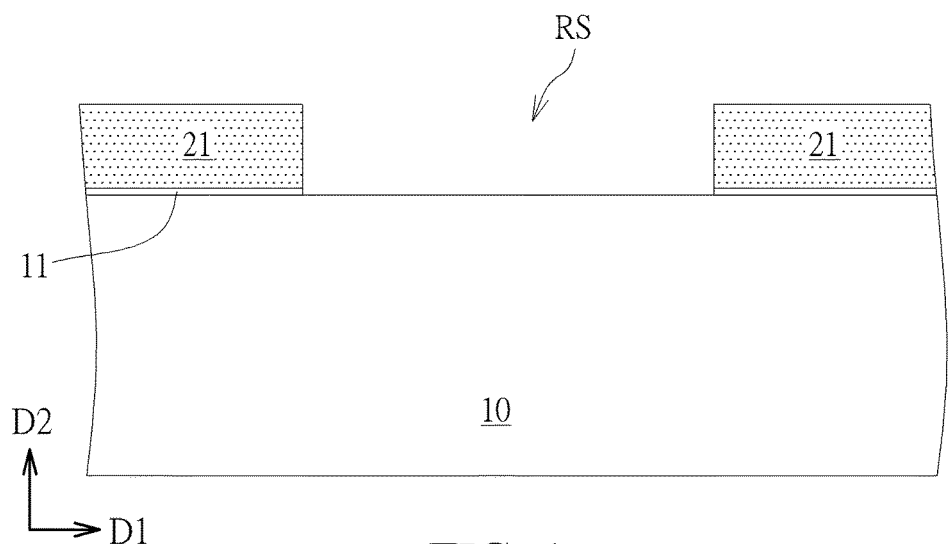

In some embodiments, the method of forming the control gate electrode 22G, the selecting gate electrode 21G, the first ONO structure S1, the second ONO structure S2, and the spacer structure P mentioned above may include but is not limited to the following steps. As shown in FIG. 1, a first gate material layer 21 is formed on the semiconductor substrate 10, and a recess RS is formed. The recess RS may penetrate the first gate material layer 21 and expose a part of the semiconductor substrate 10. In some embodiments, a gate dielectric layer 11 may be formed on the semiconductor substrate 10 before the step of forming the first gate material layer 21, and the first gate material layer 21 may be formed on the gate dielectric layer 11, but not limited thereto. In some embodiments, the recess RS may penetrate the first gate material layer 21 and the gate dielectric layer 11 for exposing a part of the semiconductor substrate 10. In other words, the recess RS may be formed by removing a part of the first gate material layer 21 and the gate dielectric layer 11, but not limited thereto. The semiconductor substrate 10 may include a silicon substrate, an epitaxial substrate, a silicon carbide substrate, or a silicon-on-insulator (SOI) substrate, but not limited thereto. The gate dielectric layer 11 may include silicon oxide, silicon oxynitride, or other appropriate dielectric materials, and the first gate material layer 21 may include polysilicon or other appropriate conductive materials.

Figure 2:
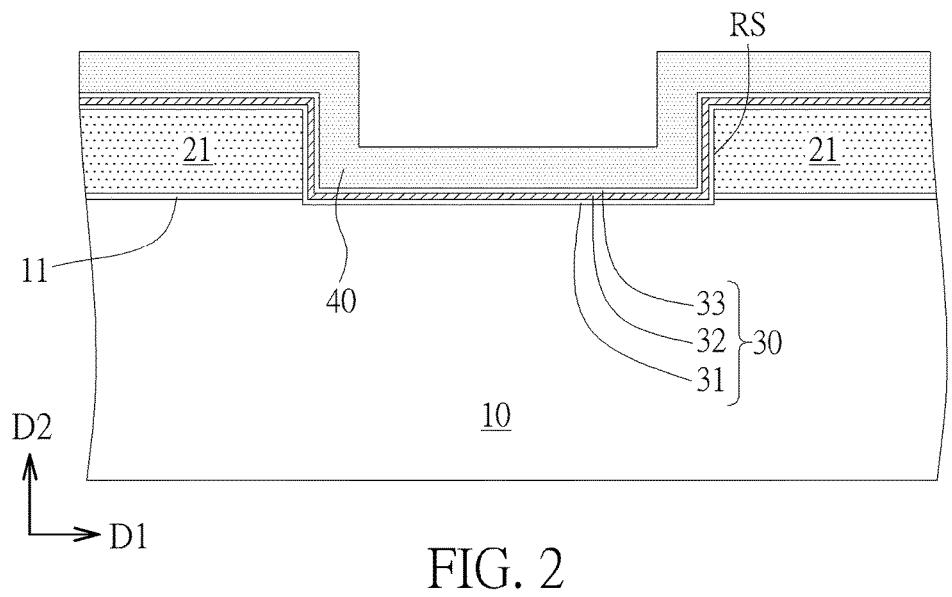

As shown in FIG. 2, an oxide-nitride-oxide stack layer 30 is then conformally on the first gate material layer 21 and in the recess RS. In some embodiments, a doped region (not shown) may be formed in the semiconductor substrate exposed by the recess RS before the step of forming the oxide-nitride-oxide stack layer 30, but not limited thereto. In some embodiments, the oxide-nitride-oxide stack layer may include a first oxide layer 31, a nitride layer 32, and a second oxide layer 33 sequentially formed on the semiconductor substrate 10. In other words, the nitride layer 32 is sandwiched between the first oxide layer 31 and the second oxide layer 32, a part of the first oxide layer 31 is located between the semiconductor substrate 10 and the nitride layer 32 in a thickness direction of the semiconductor substrate 10 (such as a second direction shown in FIG. 2), and a part of the first oxide layer 31 is located between the first gate material layer 21 and the nitride layer 32 in a horizontal direction (such as the first direction D1 shown in FIG. 2). In some embodiments, the first oxide layer 31 may be a silicon oxide layer formed by a thermal growing process, and a part of the semiconductor substrate 10 may be consumed to form the first oxide layer 31, but not limited thereto. In some embodiments, the first oxide layer 31 may be formed by other suitable processes, such as a chemical vapor deposition process. After the step of forming the oxide-nitride-oxide stack layer 30, an insulation layer 40 may be formed on the oxide-nitride-oxide stack layer 30, and a part of the insulation layer 40 is formed in the recess RS. In some embodiments, the insulation layer 40 may be conformally formed on the oxide-nitride-oxide stack layer 30 for forming the spacer structure mentioned above.

Figure 3:
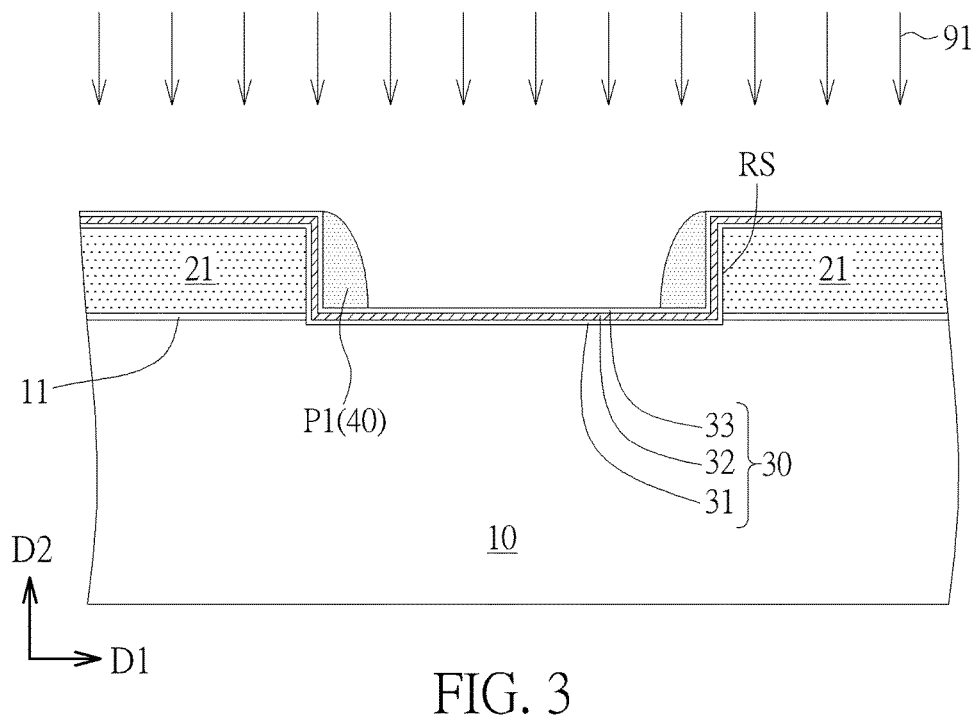
Figure 4:
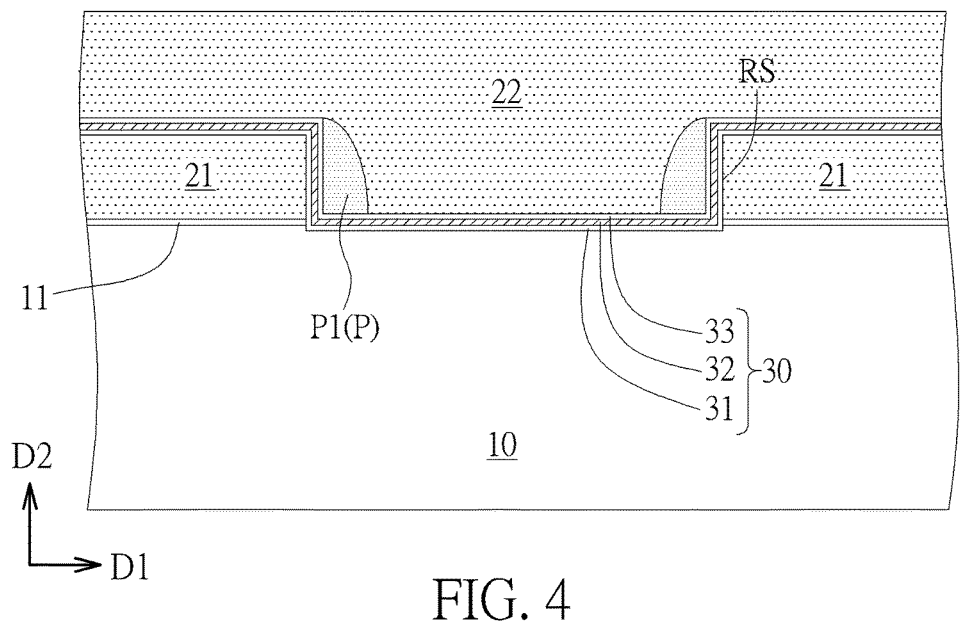

As shown in FIG. 2 and FIG. 3, an etching process 91 is then performed to remove a part of the insulation layer 40 for forming a first spacer P1 in the recess RS and exposing a part of the oxide-nitride-oxide stack layer 30 on the first gate material layer 21 and a part of the oxide-nitride-oxide stack layer 30 in the recess RS. The first spacer P1 may be at least a part of the spacer structure mentioned above. The etching process 91 may be an anisotropic etching process preferably, but not limited thereto. The material of the insulation layer 40 may be different from the second oxide layer 33 for forming the first spacer P1 by the etching process 91 with higher etching selectivity between the insulation layer 40 and the second oxide layer 33. In some embodiments, the insulation layer 40 may include a nitride material or other appropriate insulation materials. As shown in FIG. 3 and FIG. 4, a second gate material layer 22 is formed on the semiconductor substrate 10 after the etching process 91. A part of the second gate material layer 22 may be formed in the recess RS, and a part of the second gate material layer 22 may be formed on the oxide-nitride-oxide stack layer 30 located on the first gate material layer 21. In some embodiments, the recess RS may be filled with the oxide-nitride-oxide stack layer 30, the first spacer P1 and the second gate material layer 22, but not limited thereto. The second gate material layer 22 may include polysilicon or other appropriate conductive materials.

Figure 5:
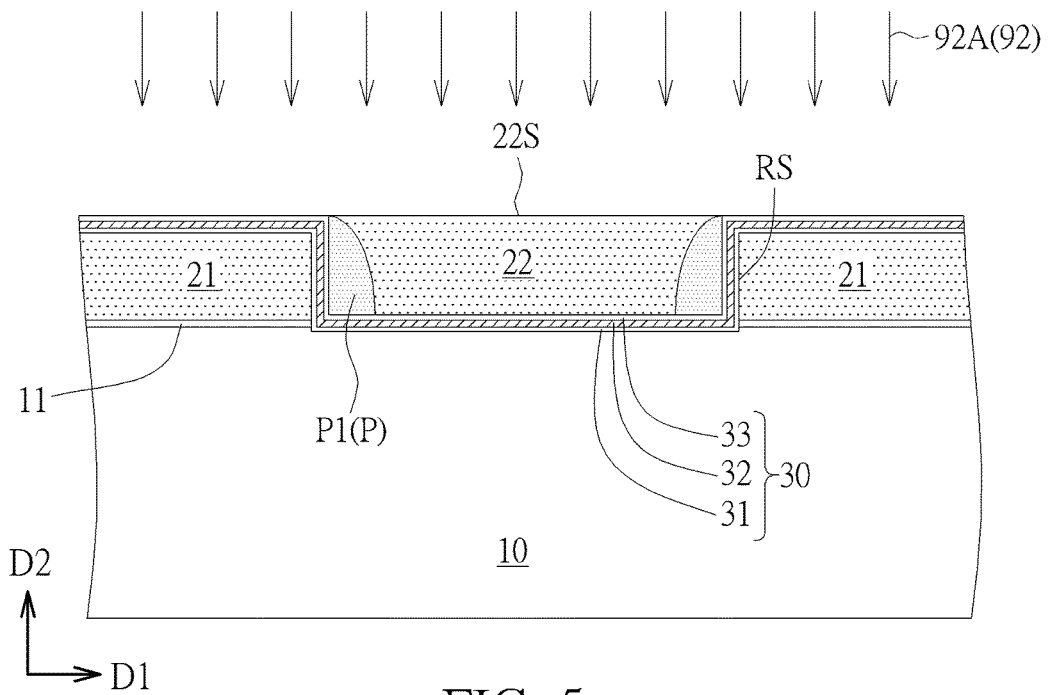

As shown in FIGS. 4-7, a planarization process 92 is performed to remove the second gate material layer 22 outside the recess RS and the oxide-nitride-oxide stack layer 30 located on the first gate material layer 21 in the second direction D2 for forming the second ONO structure S2 between the first gate material layer 21 and the second gate material layer 22 in the first direction D1. In some embodiments, the planarization process 92 may include a chemical mechanical polishing (CMP) process or other appropriate planarization approaches, and the planarization process 92 may include a plurality of steps for different removing effects. For example, as shown in FIG. 5, the planarization process 92 may include a first step 92A configured to remove the second gate material layer 22 outside the recess RS and stopped at the oxide-nitride-oxide stack layer 30. In some embodiments, the area ratio of the oxide-nitride-oxide stack layer 30 located outside the recess RS on the semiconductor substrate 10 may be higher than 50% for enhancing the performance of the endpoint detection in the first step 92A of the planarization process 92, but not limited thereto.

As shown in FIG. 5 and FIG. 6, the planarization process 92 may further include a second step 92B performed after the first step 92A, and the second step 92B may be configured to remove the oxide-nitride-oxide stack layer 30 located on the first gate material layer 21 in the second direction D2 and stopped at the first gate material layer 21. In some embodiments, a part of the spacer structure P and a part of the second gate material layer 22 may be removed by the second step 92B of the planarization process 92, and the second step 92B of the planarization process 92 may be a chemical mechanical polishing step with fixed time, but not limited thereto. In some embodiments, a top surface of the first gate material layer 21 (such as a first top surface 21S shown in FIG. 7), a top surface of the second gate material layer 22 (such as a second top surface 22S shown in FIG. 7), a top surface of the oxide-nitride-oxide stack layer 30 (such as a third top surface 30S shown in FIG. 7), and a top surface of the spacer structure P (such as a fourth top surface 40S) may be substantially coplanar after the second step 92B of the planarization process 92, but not limited thereto. Additionally, the second ONO structure S2 may be formed after the second step 92B of the planarization process 92, and the second ONO structure S2 may be composed of the first oxide layer 31, the nitride layer 32, and the second oxide layer 33 sequentially stacked in the first direction D1.

As shown in FIG. 6 and FIG. 7, the planarization process 92 may further include a third step 92C performed after the second step 92B and configured to remove a part of the first gate material layer 21 and a part of the second gate material layer 22 for reducing the heights of the first gate material layer 21 and the second gate material layer 22. In other words, the first top surface 21S of the first gate material layer 21 and the second top surface 22S of the second gate material layer 22 may be lower than the third top surface 30S of the oxide-nitride-oxide stack layer 30 and the fourth top surface 40S of the spacer structure P in the second direction D2 after the third step 92C of the planarization process 92.

As shown in FIG. 7 and FIG. 8, after the planarization process 92, the first gate material layer 21 may be patterned to become the selecting gate electrode 21G, the second gate material layer 22 in the recess RS may be patterned to become the control gate electrode 22G, and the oxide-nitride-oxide stack layer 30 in the recess RS may be patterned to become the first ONO structure S1. A SONOS memory structure may be constructed by the semiconductor substrate 10, the first ONO structure S1, and the control gate electrode 22G stacked in the second direction D2. The first ONO structure S1 is located between the control gate electrode 22G and the semiconductor substrate 10 in the second direction D2 perpendicular to the first direction D1, and the first ONO structure S1 includes a first bottom oxide layer S11, a first nitride layer S12, and a first top oxide layer S13 overlapping one another in the second direction D2. Additionally, in some embodiments, a third spacer 50 may be formed on the outer sidewalls of the selecting gate electrode 21G and the control gate electrode 22G, a lightly doped region 61 may be formed in the semiconductor substrate 10 under the third spacer 50, a source line 62 may be formed in the semiconductor substrate 10 at an outer side of the selecting gate electrode 21G, and a bit line 63 may be formed in the semiconductor substrate 10 at an outer side of the control gate electrode 22G. The structure shown in FIG. 8 may be regarded as a memory cell of a non-volatile memory device 101, but not limited thereto. The distance DS between the control gate electrode 22G and the selecting gate electrode 21G in the first direction D1 may be smaller than or equal to the sum of the first width W1 of the second ONO structure S2 in the first direction D1 and the second width W2 of the spacer structure P in the first direction D1 because the selecting gate electrode 21G and the control gate electrode 22G may be separated from each other in the first direction D1 by the second ONO structure S2 and the spacer structure P only. The distance DS between the control gate electrode 22G and the selecting gate electrode 21G may be reduced accordingly, and the density of the memory cells in the non-volatile memory device 101 may be enhanced because the area of each of the memory cells may be reduced also.

In some embodiments, the second ONO structure S2 may include a second bottom oxide layer S21, a second nitride layer S22, and a second top oxide layer S23 overlapping one another in the first direction D1, and the second ONO structure S2 may be directly connected with the first ONO structure S1. Additionally, the first width W1 of the second ONO structure S2 in the first direction D1 may also be regarded as the sum of the thickness of the second bottom oxide layer S21, the thickness of the second nitride layer S22, and the thickness of the second top oxide layer S23 in the first direction D1.

As shown in FIG. 8, the non-volatile memory device 101 in this embodiment may include the semiconductor substrate 10, the control gate electrode 22G, the first ONO structure S1, the selecting gate electrode 21G, the second ONO structure S2, and the spacer structure P. The control gate electrode 22G and the selecting gate electrode 21G are disposed on the semiconductor substrate 10. The first ONO structure S1 is disposed between the control gate electrode 22G and the semiconductor substrate 10. The second ONO structure S2 is disposed between the control gate electrode 22G and the selecting gate electrode 21G in the first direction D1. The spacer structure P is disposed between the control gate electrode 22G and the second ONO structure S2 in the first direction D1. The distance DS between the control gate electrode 22G and the selecting gate electrode 21G in the first direction D1 may be smaller than or equal to the sum of the first width W1 of the second ONO structure S2 and the second width W2 of the spacer structure P in the first direction D1 because the selecting gate electrode 21G and the control gate electrode 22G may be separated from each other in the first direction D1 by the second ONO structure S2 and the spacer structure P only.

A shown in FIG. 8, the first ONO structure S1 is disposed between the control gate electrode 22G and the semiconductor substrate 10 in the second direction D2 perpendicular to the first direction D1, and the first ONO structure S1 may include the first bottom oxide layer S11, the first nitride layer S12, and the first top oxide layer S13 overlapping one another in the second direction D2. In other words, the first bottom oxide layer S11 is disposed between the first nitride layer S12 and the semiconductor substrate 10, and the first nitride layer S12 is disposed between the first bottom oxide layer S11 and the first top oxide layer S13. The second ONO structure S2 may include the second bottom oxide layer S21, the second nitride layer S22, and the second top oxide layer S23 overlapping one another in the first direction D1. In other words, the second bottom oxide layer S21 is disposed between the second nitride layer S22 and the selecting gate electrode 21G in the first direction D1, and the second nitride layer S22 is disposed between the second bottom oxide layer S21 and the second top oxide layer S23 in the first direction D1. In some embodiments, the first bottom oxide layer S11 may be directly connected with the second bottom oxide layer S21, and the material of the first bottom oxide layer S11 may be the same as the material of the second bottom oxide layer S21, but not limited thereto. In some embodiments, the first nitride layer S12 may be directly connected with the second nitride layer S22, and the material of the first nitride layer S12 may be the same as the material of the second nitride layer S22, but not limited thereto. In some embodiments, the first top oxide layer S13 may be directly connected with the second top oxide layer S23, and the material of the first top oxide layer S13 may be the same as the material of the second top oxide layer S23, but not limited thereto. In other words, the first oxide layer 31 disposed between the nitride layer 32 and the semiconductor substrate 10 in the second direction D2 may be regarded as the first bottom oxide layer S11, and the first oxide layer 31 disposed between the nitride layer 32 and the selecting gate electrode 21G in the first direction D1 may be regarded as the second bottom oxide layer S21. The nitride layer 32 disposed between the first oxide layer 31 and the second oxide layer 33 in the second direction D2 may be regarded as the first nitride layer S12 of the first ONO structure S1, and the nitride layer 32 disposed between the first oxide layer 31 and the second oxide layer 33 in the first direction D1 may be regarded as the second nitride layer S22 of the second ONO structure S2. The second oxide layer 33 disposed between the control gate electrode 22G and the nitride layer 32 in the second direction D2 and the second oxide layer 33 disposed between the spacer structure P and the nitride layer 32 in the second direction D2 may be regarded as the first top oxide layer S13, and the second oxide layer 33 disposed between the spacer structure P and the nitride layer 32 in the first direction D1 may be regarded as the second top oxide layer S23.

A shown in FIG. 8, in some embodiments, the non-volatile memory device 101 may further include the gate dielectric layer 11, the third spacer 50, the lightly doped region 61, the source line 62, and the bit line 63, but not limited thereto. The third spacer 50 may be formed on the outer sidewalls of the selecting gate electrode 21G and the control gate electrode 22G, the lightly doped region 61 may be formed in the semiconductor substrate 10 under the third spacer 50, the source line 62 may be formed in the semiconductor substrate 10 at the outer side of the selecting gate electrode 21G, and the bit line 63 may be formed in the semiconductor substrate 10 at the outer side of the control gate electrode 22G. The density of the memory cells in the non-volatile memory device 101 may be enhanced because the area of each of the memory cells may be reduced by reducing the distance DS between the selecting gate electrode 21G and the control gate electrode 22G within the same memory cell.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 9:
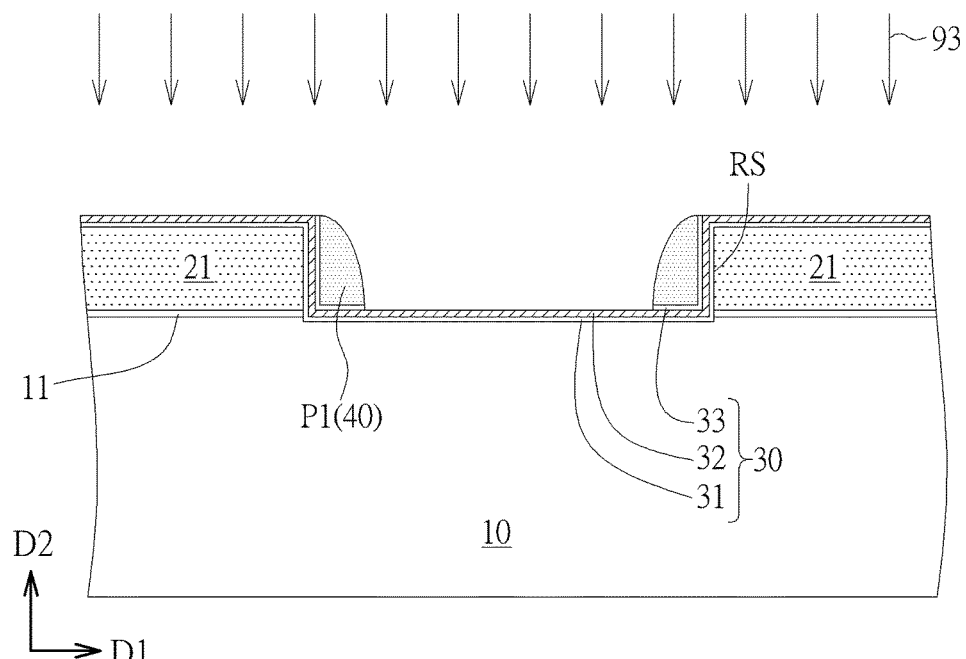
Figure 10:
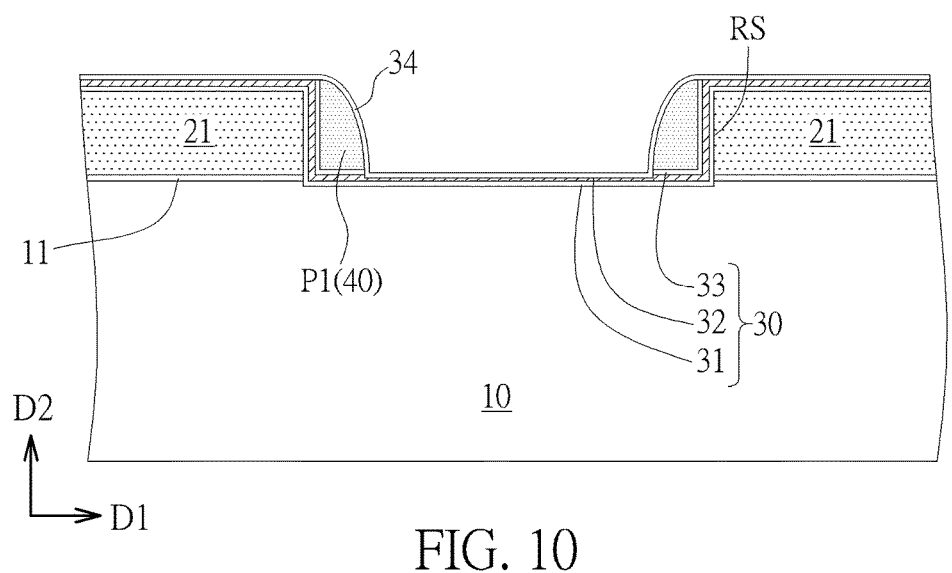
Figure 11:
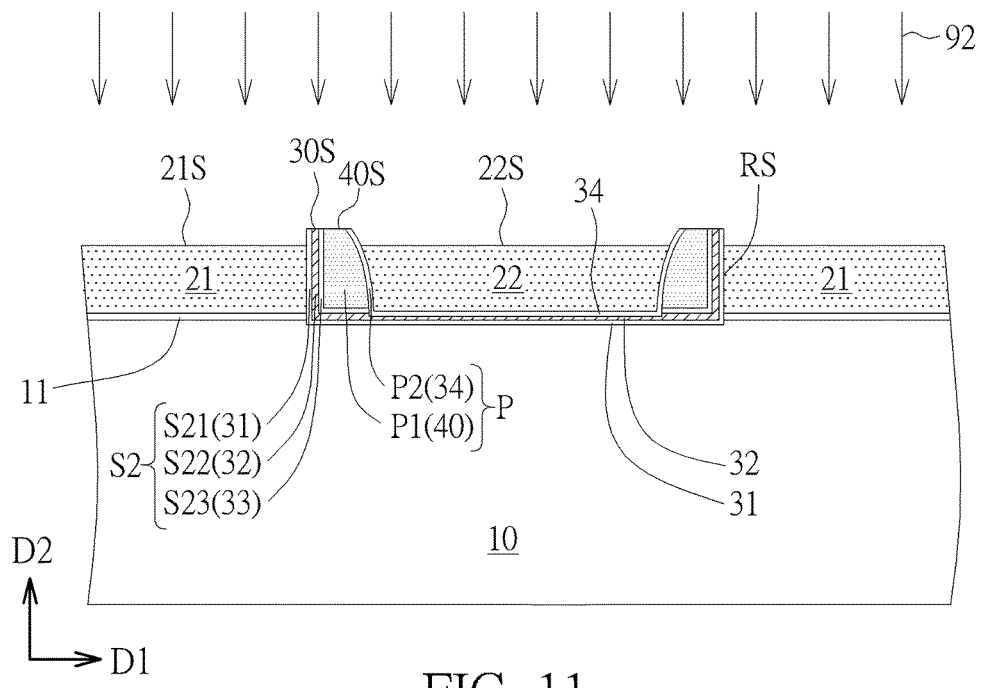

Please refer to FIG. 3 and FIGS. 9-12. FIGS. 9-12 are schematic drawings illustrating a manufacturing method of a non-volatile memory device 102 according to a second embodiment of the present invention, and FIG. 9 may be regarded as a schematic drawing in a step subsequent to FIG. 3. As shown in FIG. 3 and FIG. 9, in the manufacturing method of this embodiment, a removing process 93 may be performed to remove the second oxide layer 33 of the oxide-nitride-oxide stack layer 30 formed in the recess RS and exposed by the insulation layer 40 after the etching process 91 of forming the first spacer P1 and before the step of forming the second gate material layer (not shown in FIG. 3 and FIG. 9). In other words, a part of the second oxide layer 33 is not covered by the first spacer P1 after the etching process 91, and the second oxide layer 33 which is not covered by the first spacer P1 may be removed by the removing process 93. The removing process 93 may include an oxide pre-clean process or other appropriate removing processes. As shown in FIG. 9 and FIG. 10, a third oxide layer 34 may be formed on the nitride layer 32 in the recess RS after the etching process 93 and before the step of forming the second gate material layer (not shown in FIG. 9 and FIG. 10). The third oxide layer 34 may be formed by a thermal oxidation process, such as an in-situ steam generation (ISSG) technology, but not limited thereto. In some embodiments, the third oxide layer 34 may be formed by other appropriate oxidation processes or deposition processes. Accordingly, a material density of the third oxide layer 34 may be different from the material density of the second oxide layer 33. For example, a silicon oxide density of the third oxide layer 34 may be higher than a silicon oxide density of the second oxide layer 33 for improving the electrical performance of the non-volatile memory device, but not limited thereto. In addition, the third oxide layer 34 may be further formed on the first spacer P1 and formed outside the recess RS. As shown in FIG. 10 and FIG. 11, the planarization process 92 may further remove the third oxide layer 34 formed outside the recess RS for forming a second spacer P2 on the first spacer P1. In other words, the third oxide layer 34 formed on the first spacer P1 may become the second spacer P2 by the planarization process 92, and the spacer structure P in this embodiment may be composed of the first spacer P1 and the second spacer P2.

Figure 12:
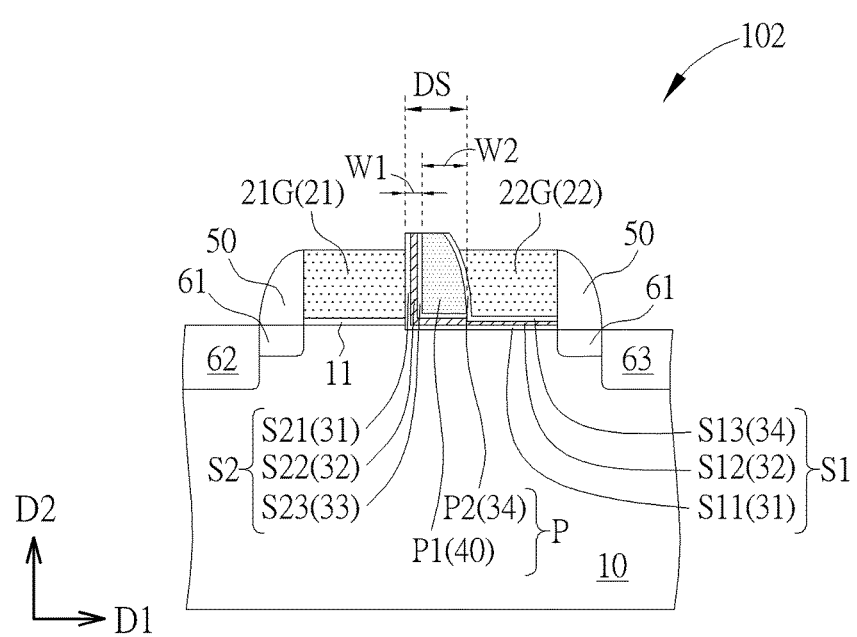

As shown in FIG. 11 and FIG. 12, the first oxide layer 31, the nitride layer 32, and the third oxide layer 34 in the recess RS are patterned to become the first ONO structure S1 after the planarization process 92. As shown in FIG. 12, the difference between the non-volatile memory device 102 and the non-volatile memory device in the first embodiment mentioned above is that the first top oxide layer S13 of the first ONO structure S1 may include the third oxide layer 34 described above, and a material density of the first top oxide layer S13 may be different from the material density of the second top oxide layer S23. Additionally, the spacer structure P in this embodiment may include the first spacer P1 and the second spacer P2, and the second spacer P2 is disposed between the first spacer P1 and the control gate electrode 22G in the first direction D1. The material of the first spacer P1 may be different from the material of the second spacer P2, and the material of the second spacer P2 may be the same as the first top oxide layer S13. For example, in some embodiments, the first spacer P1 may be a nitride spacer, and the second spacer P2 may be an oxide spacer, but not limited thereto.

To summarize the above descriptions, according to the non-volatile memory device and the manufacturing method thereof in the present invention, the distance between the control gate electrode and the selecting gate electrode may be reduced by separating the control gate electrode and the selecting gate electrode with the spacer structure and the second ONO structure only. The area of each of the memory cells may be reduced accordingly, and the density of memory cells in the non-volatile memory device may be enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory device, comprising:
   a semiconductor substrate;
   a control gate electrode disposed on the semiconductor substrate;
   a first oxide-nitride-oxide (ONO) structure disposed between the control gate electrode and the semiconductor substrate, wherein the control gate electrode directly and physically contacts the first ONO structure;
   a selecting gate electrode disposed on the semiconductor substrate;
   a second ONO structure disposed between the control gate electrode and the selecting gate electrode in a first direction; and
   a spacer structure disposed between the control gate electrode and the second ONO structure in the first direction, wherein a distance between the control gate electrode and the selecting gate electrode in the first direction is smaller than or equal to a sum of a width of the second ONO structure and a width of the spacer structure in the first direction,
   wherein the first ONO structure is disposed between the control gate electrode and the semiconductor substrate in a second direction perpendicular to the first direction, and the first ONO structure comprises a first bottom oxide layer, a first nitride layer, and a first top oxide layer overlapping one another in the second direction, wherein the second ONO structure comprises a second bottom oxide layer, a second nitride layer, and a second top oxide layer overlapping one another in the first direction, the first top oxide layer is directly connected with the second top oxide layer, and the material of the first top oxide layer is the same as the material of the second top oxide layer.

2. The non-volatile memory device according to claim 1, wherein the first bottom oxide layer is directly connected with the second bottom oxide layer, and the material of the first bottom oxide layer is the same as the material of the second bottom oxide layer.

3. The non-volatile memory device according to claim 1, wherein the first nitride layer is directly connected with the second nitride layer, and the material of the first nitride layer is the same as the material of the second nitride layer.

4. A manufacturing method of a non-volatile memory device, comprising:
   forming a control gate electrode on a semiconductor substrate;
   forming a first oxide-nitride-oxide (ONO) structure between the control gate electrode and the semiconductor substrate, wherein the control gate electrode directly and physically contacts the first ONO structure;
   forming a selecting gate electrode on the semiconductor substrate; and
   forming a second ONO structure and a spacer structure between the control gate electrode and the selecting gate electrode in a first direction, wherein a distance between the control gate electrode and the selecting gate electrode in the first direction is smaller than or equal to a sum of a width of the second ONO structure and a width of the spacer structure in the first direction,
   wherein the first ONO structure is disposed between the control gate electrode and the semiconductor substrate in a second direction perpendicular to the first direction, and the first ONO structure comprises a first bottom oxide layer, a first nitride layer, and a first top oxide layer overlapping one another in the second direction, wherein the second ONO structure comprises a second bottom oxide layer, a second nitride layer, and a second top oxide layer overlapping one another in the first direction, the first top oxide layer is directly connected with the second top oxide layer, and the material of the first top oxide layer is the same as the material of the second top oxide layer.

5. The manufacturing method of the non-volatile memory device according to claim 4, wherein the step of forming the spacer structure comprises:
   forming a first gate material layer on the semiconductor substrate;
   forming a recess penetrating the first gate material layer and exposing a part of the semiconductor substrate;
   forming an oxide-nitride-oxide stack layer conformally on the first gate material layer and in the recess;
   forming an insulation layer on the oxide-nitride-oxide stack layer; and
   performing an etching process to remove a part of the insulation layer for forming a first spacer in the recess and exposing a part of the oxide-nitride-oxide stack layer on the first gate material layer and a part of the oxide-nitride-oxide stack layer in the recess.

6. The manufacturing method of the non-volatile memory device according to claim 5, wherein the step of forming the second ONO structure comprises:
   forming a second gate material layer on the semiconductor substrate after the etching process, wherein a part of the second gate material layer is formed in the recess, and a part of the second gate material layer is formed on the oxide-nitride-oxide stack layer located on the first gate material layer; and
   performing a planarization process to remove the second gate material layer outside the recess and the oxide-nitride-oxide stack layer on the first gate material layer for forming the second ONO structure between the first gate material layer and the second gate material layer in the first direction.

7. The manufacturing method of the non-volatile memory device according to claim 6, wherein the second gate material layer in the recess is patterned to become the control gate electrode after the planarization process.

8. The manufacturing method of the non-volatile memory device according to claim 6, wherein the first gate material layer is patterned to become the selecting gate electrode after the planarization process.

9. The manufacturing method of the non-volatile memory device according to claim 6, wherein the oxide-nitride-oxide stack layer in the recess is patterned to become the first ONO structure after the planarization process.

10. The manufacturing method of the non-volatile memory device according to claim 6, wherein the planarization process comprises:
- a first step configured to remove the second gate material layer outside the recess and stopped at the oxide-nitride-oxide stack layer;
- a second step performed after the first step, wherein the second step is configured to remove the oxide-nitride-oxide stack layer on the first gate material layer and stopped at the first gate material layer; and
- a third step performed after the second step and configured to remove a part of the first gate material layer and a part of the second gate material layer, wherein a top surface of the first gate material layer and a top surface of the second gate material layer are lower than a top surface of the spacer structure after the third step of the planarization process.

* * * * *